(12) United States Patent
Nikutta

(10) Patent No.: US 7,024,578 B2
(45) Date of Patent: Apr. 4, 2006

(54) ARRAY OF SYNCHRONIZED MEMORY MODULES

(75) Inventor: Wolfgang Nikutta, Munich (DE)

(73) Assignee: Infineon Technologies AG, Munich (DE)

( * ) Notice: Subject to any disclaimer, the term of this patent is extended or adjusted under 35 U.S.C. 154(b) by 509 days.

(21) Appl. No.: 10/302,805

(22) Filed: Nov. 22, 2002

(65) Prior Publication Data

US 2003/0126378 A1 Jul. 3, 2003

(30) Foreign Application Priority Data

Nov. 30, 2001 (DE) ................................ 101 59 180

(51) Int. Cl.
*G06F 12/00* (2006.01)

(52) U.S. Cl. ................. 713/401; 713/400; 365/230.03; 365/230.04; 711/5; 711/105; 711/167

(58) Field of Classification Search ................ 713/400, 713/401; 711/167, 5, 105; 365/230.03, 365/230.04
See application file for complete search history.

(56) References Cited

U.S. PATENT DOCUMENTS

| | | | |
|---|---|---|---|
| 5,357,621 A | 10/1994 | Cox | |
| 5,651,129 A | 7/1997 | Yokote et al. | |
| 5,917,482 A * | 6/1999 | Putnam | 715/748 |
| 5,974,104 A * | 10/1999 | Dhara | 375/368 |
| 6,034,878 A * | 3/2000 | Osaka et al. | 365/52 |
| 6,044,206 A * | 3/2000 | Kohn | 709/248 |
| 6,073,203 A | 6/2000 | Kufer et al. | 711/5 |
| 6,088,774 A | 7/2000 | Gillingham | |
| 6,208,582 B1 * | 3/2001 | Kanda et al. | 365/233 |
| 6,317,352 B1 | 11/2001 | Halbert et al. | |
| 6,480,946 B1 * | 11/2002 | Tomishima et al. | 711/167 |
| 6,804,756 B1 * | 10/2004 | Pascucci | 711/167 |
| 6,832,320 B1 * | 12/2004 | Broyles et al. | 713/200 |

FOREIGN PATENT DOCUMENTS

DE 19750927 11/1997

OTHER PUBLICATIONS

German Office Action, dated Feb. 7, 2005, 4 pages.
Prof. Dr.-Ing. Georg Färber et al., "Bussysteme, Parallele und serielle Bussysteme, lokale Netze" R. Oldenbourg Verlag München Wien (1987).

* cited by examiner

*Primary Examiner*—A. Elamin
(74) *Attorney, Agent, or Firm*—Fish & Richardson P.C.

(57) ABSTRACT

A memory apparatus includes a memory module array having several memory modules. Each memory module has a synchronization connection for receiving a synchronization signal for synchronizing the memory module relative to the other memory modules in the memory module array. This enables combining data bursts read from the memory modules into a data stream.

20 Claims, 6 Drawing Sheets

ARRAY OF SYNCHRONIZED MEMORY MODULES

FIELD OF INVENTION

The present invention relates generally to memory apparatuses for storing data streams, and relates in particular to a memory apparatus and a method for storing and for reading data streams in and from a memory module array formed from at least two memory modules.

RELATED APPLICATIONS

This application claims the benefit of the Nov. 30, 2001 filing date of German application 101 59 180.2, the contents of which are herein incorporated by reference.

BACKGROUND

To increase the computation power of today's computer systems, it is necessary to increase not only the clock frequency of a CPU (Central Processing Unit) but also the speed or bandwidth of system components. Conventionally, fast dynamic read/write memories (DRAM, Dynamic Random-Access Memories) are developed by improving semiconductor technologies, increasing clock rates, etc., which is reflected in the name of the memory systems, such as PC66, PC100, PC133, PC166, ... etc., or, by way of example, data bus widths are increased by using up to 32 I/Os in the case of SGRAMs for graphics applications.

It is also customary to double a data rate (double data rate, DDR) by using both clock edges, i.e. a rising clock edge and a falling clock edge of the clock signal provided by a clock generator for the purpose of clocking the memory apparatus. In this context, the problem with conventional memory apparatuses is that the DRAMs used need to be synchronized to the frequency of the clock signal—or in the case of DDR methods, to twice the frequency of the clock signal—and need to drive commands, addresses and data streams internally at the same frequency. This disadvantageously results in a high power loss in DRAM chips and in severe stray coupling via driver circuits, internal voltage sources and input/output buffers.

Another inexpediency is that addressing a memory module in a conventional memory module array involves only one memory becoming active. Disadvantageously, it is necessary to provide identification or an identifier or prior decoding for a specific memory module which is to be addressed.

To reduce power consumption in memory apparatuses based on the prior art, the internal supply voltages have been reduced to date, since the power consumption of the memory chip is proportional to the square of these supply voltages. In addition, attempts have been made to reduce the I/O levels or to dissipate an excessive power loss directly by using heat sinks (SGRAM and RAMBUS).

Another drawback of memory apparatuses based on the prior art is that the memory modules driving commands, addresses or data streams internally at the same frequency are sensitive to radio-frequency interference.

SUMMARY

It is therefore an object of the present invention to provide a memory apparatus having a memory module array in which the internal clock frequency, the power loss and the influence of radio-frequency interference in individual memory modules are reduced, and increased data rates are made available for storing data streams in the memory module array and for reading data streams from the memory module array.

A fundamental concept of the invention is that of operating at least two memory modules in a memory module array in sync such that a synchronization signal ensures that specific memory modules are addressed successively and the data bursts read from these memory modules can be combined to form a data stream.

It is thus an advantage of the present invention that a high data rate can be made available for storing data bursts in conventional memory modules. In this context, a synchronization signal in the form of individual synchronization pulses runs successively through parallel-connected memory modules in the memory module array. Advantageously, the low internal clock frequency reduces power loss in the individual memory modules, which means that cooling can be dispensed with.

Since the individual memory modules are addressed successively and hence at a lower clock rate, much smaller stray coupling effects ("noise") arise within the memory module array than in conventional memory apparatuses.

The data rates which can be achieved are also increased significantly when using conventional memory modules or when using slightly modified, conventional memory modules, such as SDRAMs and DDRAMs.

In addition, it is a cost advantage that conventional or slightly modified memory modules, such as DRAMs, can be used in the inventive memory module array. Another significant cost advantage is that the memory elements can be used at conventional slow data rates, despite the high data rates achieved in the system.

The inventive method for storing and for reading data streams in and from a memory module array formed from at least one memory module essentially has the following steps:

a) the at least one data stream comprising data bursts and transmitted via a data bus is stored in the memory module array under the control of a clock signal, generated by the clock generator, a command bus and an address bus, with successive data bursts of the data stream being stored in successive memory modules in the memory module array on the basis of a synchronization signal;

b) the data bursts stored in the memory modules in the memory module array are read on the basis of the synchronization signal, which is supplied to the memory modules successively in the form of synchronization pulses;

c) the data bursts which are read are assembled or combined to form a data stream, with the synchronization signal, which comprises synchronization pulses, providing time positioning for the respective data bursts in the data stream; and d) the assembled data stream is output from the memory module array via the data bus.

In line with one preferred development of the present invention, the memory module array formed from the memory modules is operated as a synchronized array to which the data bursts of the data stream are written or stored staggered over time.

In line with another preferred development of the present invention, the memory module array formed from the memory modules is operated as a synchronized array from which the data bursts of the data stream are read staggered over time, so that a data stream can advantageously be output via the data bus.

In line with yet another preferred development of the present invention, the synchronization signal supplied to a respective synchronization connection on the memory modules synchronizes the memory module array with the clock signal.

In line with yet another preferred development of the present invention, the clock signal generated by the clock generator is supplied to each of the memory modules in the memory module array in parallel.

In line with yet another preferred development of the present invention, the data stream transmitted via the data bus is supplied to each of the memory modules in the memory module array in parallel.

In line with yet another preferred development of the present invention, command data streams transmitted via the command bus are supplied to each of the memory modules in the memory module array in parallel. It is also advantageous that, in a "mixed mode", identical command data streams or address data streams do not need to be available for all the memory modules in the memory module array.

Optionally, command data streams and address data streams can be modified for each memory module within a write or read cycle in the memory module array. By way of example, the first memory module can access an address A1 using a command C1 while the second memory module addresses an address A2 using the command C2, etc. It is thus a simple matter to address only a specifically prescribable part of the memory modules, so that subsidiary memory module arrays (subarrays) are formed by virtue of the masked memory modules receiving NOP (No Operation) commands and thus being deactivated.

In line with yet another preferred development of the present invention, address data streams transmitted via the address bus are supplied to each of the memory modules in the memory module array in parallel.

In line with yet another preferred development of the present invention, data bursts are stored in the memory modules in the memory module array at a multiple data rate such that multiple data bursts can be stored in a memory module for each clock cycle of the clock signal generated by the clock generator.

In line with yet another preferred development of the present invention, data bursts are read from the memory modules in the memory module array at a multiple data rate such that multiple data bursts can be read from the memory module for each clock cycle of the clock signal generated by the clock generator, with the data bursts which are read advantageously being able to be assembled to form a data stream which can be read from the memory module array.

In line with yet another preferred development of the present invention, the synchronization signal is formed from individual synchronization pulses which are forwarded successively and in sync with the clock signal provided by the clock generator from one memory module to the respective next memory module in the memory module array.

In line with yet another preferred development of the present invention, the synchronization signal formed from the individual synchronization pulses is forwarded successively by a prescribable number of clock cycles of the clock signal provided by the clock generator from one memory module to the respective next memory module in the memory module array. In this context, there is advantageously no need for synchronization with the clock signal.

In line with yet another preferred development of the present invention, the synchronization signal formed from the individual synchronization pulses is made available within a prescribable synchronization time interval with respect to the clock signal provided by the clock generator, with a synchronization pulse advantageously being used as an uncritical activation signal which can be modified within a wide variation range.

In addition, the inventive memory apparatus for storing data streams and for reading stored data streams has:

a) at least one memory module, which is assembled to form a memory module array;

b) a memory controller;

c) a clock generator for generating a clock signal;

d) a command bus for transmitting command data streams; and e) an address bus for transmitting address data streams, the memory modules in the memory module array each having a synchronization connection for connecting a synchronization signal, so that the memory modules are synchronized with one another, with data bursts stored in the memory modules and read therefrom being able to be combined to form the data stream.

Exemplary embodiments of the invention are shown in the drawings and are explained in more detail in the description below.

BRIEF DESCRIPTION OF THE DRAWINGS

In the drawings.

Identical reference symbols in the Figures denote components or steps which are identical or have the same function.

DETAILED DESCRIPTION

Figure 1:
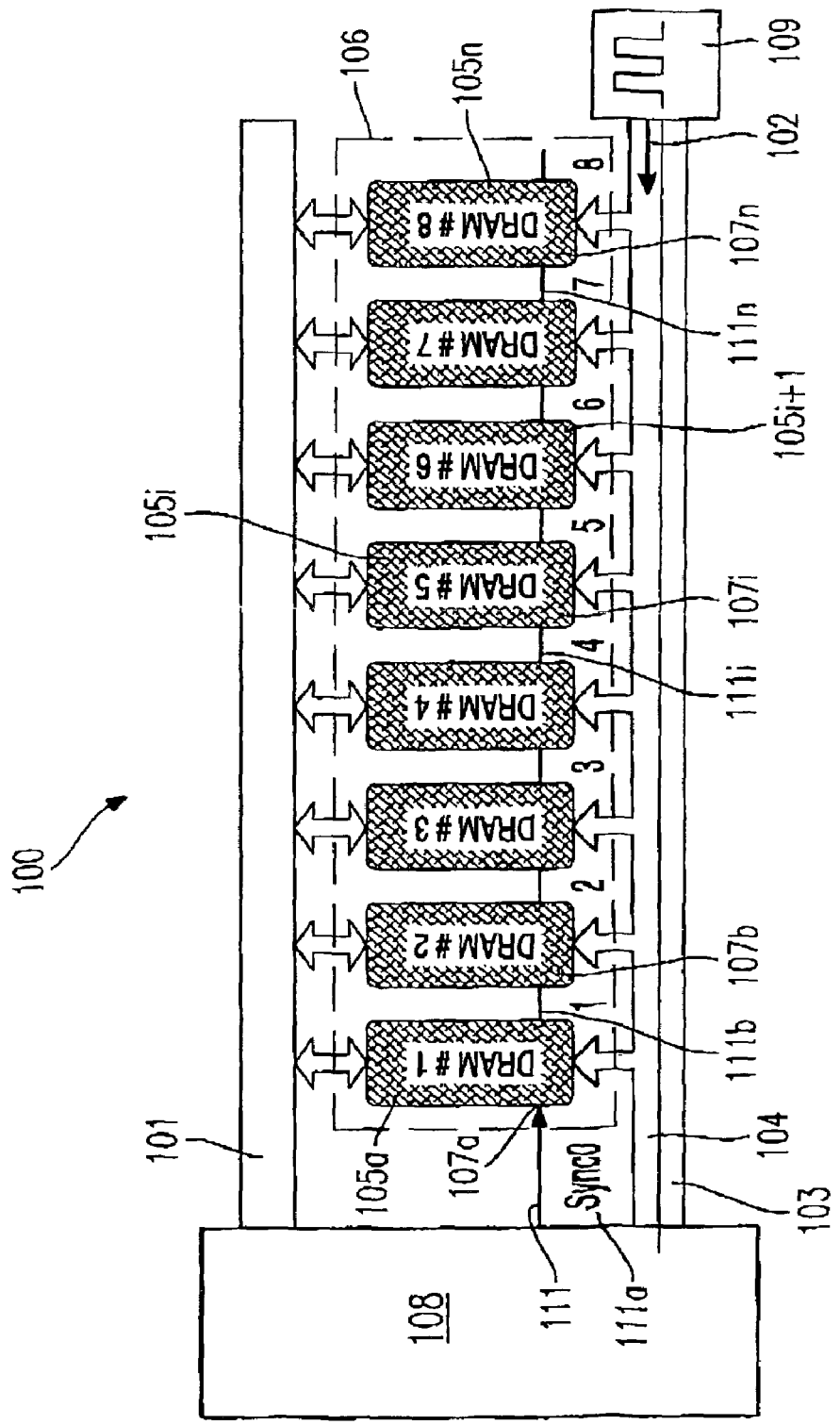
FIG. 1 shows an inventive memory apparatus having a memory module array which is formed from eight memory chips.

In the memory apparatus 100 shown in FIG. 1, a memory module array 106 is shown which comprises, by way of example, eight memory modules 105a–105i–105n. It will be pointed out that more or fewer than eight memory modules 105 can be provided in the memory module array 106, with i denoting a sequential index and 105i+1 denoting a memory module array which follows a memory module array 105i, as illustrated in FIG. 1.

In line with the invention, the individual memory modules are connected in parallel to a command bus 103, an address bus 104 and a data bus 101. In addition, all the memory modules 105a–105n are supplied in parallel with a clock signal 102 which is generated in a clock generator 109.

A synchronization signal 111 is supplied in the form of a first synchronization pulse 111a to a first synchronization connection on the first memory module 105a, whereupon the subsequent synchronization pulses 111b–111n run—like a chain—successively through the memory module array 106. An output on the respective preceding memory module 105a–105n–1 outputs a respective synchronization pulse 111a–111n to the synchronization connection 107b–107n on the respective subsequent memory module 105b–105n.

The memory controller 108 contains a device for generating the at least one synchronization signal 111, which is supplied to a first memory module 105a in the series of memory modules 105a–105n.

The data stream 112 supplied via the data bus 101 comprises individual data bursts 110 of prescribable size, as will be explained with reference to FIG. 2. In line with the invention, this data stream 112 is now split over the memory modules 105a–105n connected in parallel in such a way that respective individual data bursts 110a–110n, staggered over time, in the data stream 112 are split over the individual memory modules 105a–105n in the memory module array 106 such that, by way of example, a first data burst 110a is stored in the first memory module 105a, a second data burst 110b is stored in the second memory module 105b, an ith data burst 110i is stored in the ith memory module 105i in the memory module array 106, etc. To control the reading of a stored data stream 112, or to control the storage of a data stream 112 in the memory module array 106, the invention uses a synchronization signal 111 formed by individual synchronization pulses 111a–111n.

These synchronization pulses 111a–111n are in turn synchronized with one another and with the clock signal 102 generated by the clock signal generator 109.

Figure 2:
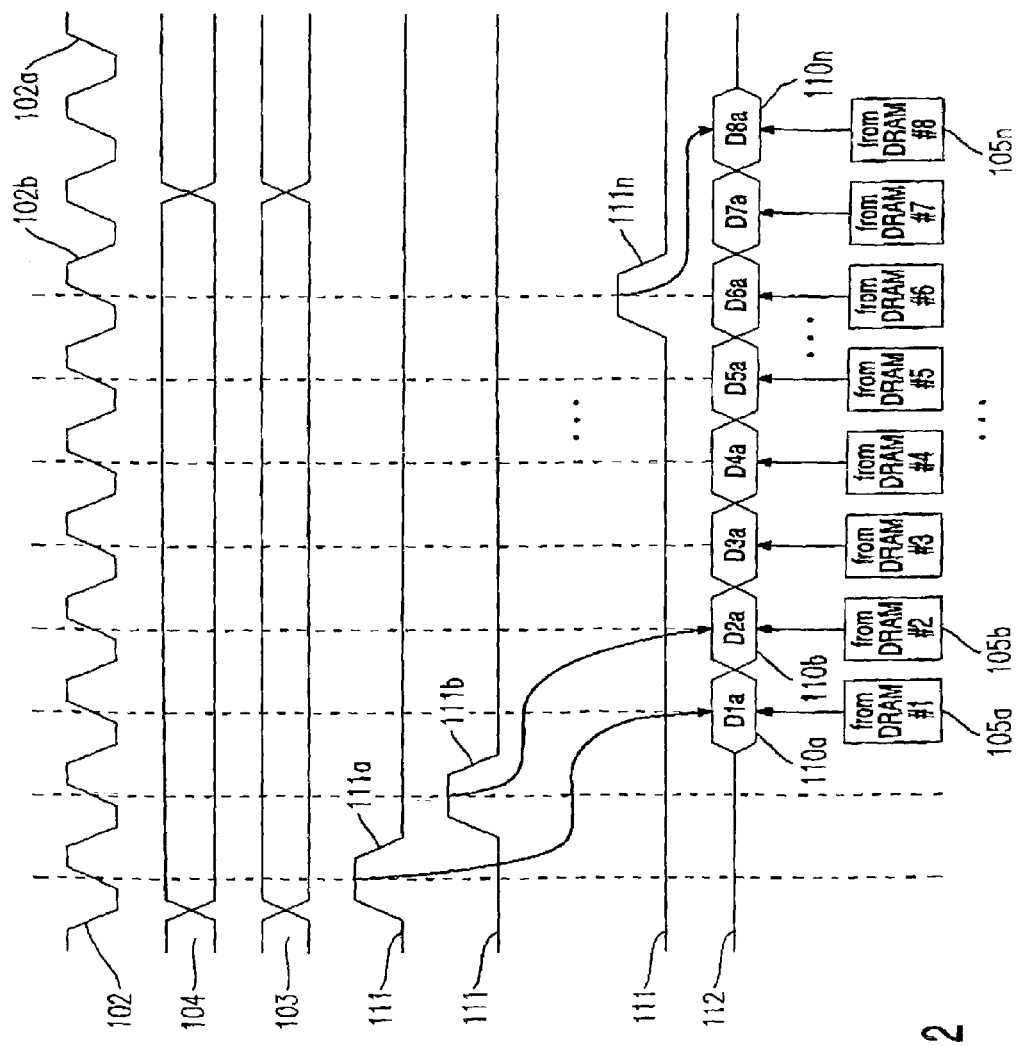
FIG. 2 shows a timing diagram which illustrates the responses of the clock signal, of the address bus, of the command bus, of the synchronization signal and of the data bus in relation to one another.

In the example shown in FIG. 2, a synchronization pulse 111a–111n respectively appears on a positive, i.e. rising, clock edge 102a of the clock signal 102. The parallel-connected memory modules 105a–105n in the memory module array 106 each have a synchronization connection 107a–107n. The first synchronization connection 107a is supplied with the first synchronization pulse 111a of the synchronization signal 111. FIG. 2 illustrates that, as a result of the first synchronization pulse 111a, a first data burst 110a of the data stream 112 is read from the first memory module 105a. The second data burst 105b of the data stream 112 is read from the memory module 110b when the second synchronization pulse 111b appears.

The read mode thus described continues until the last data burst 110n of the data stream 112 is read from the last parallel-connected memory module 105n when the last synchronization pulse 111n appears. The staggering of the synchronization pulses 111a–111n of the synchronization signal 111 over time assembles, as illustrated at the bottom of FIG. 2, a data stream 112 comprising the data bursts D1a–D8a, or generally the data bursts 110a–110n, and allows it to be read via the data bus 110.

In the present invention's exemplary embodiment shown in FIG. 1, the inventive sequence of the synchronization pulses 111a–111n staggered over time in line with the individual data bursts 110a–110n is produced by virtue of the first memory module 105a being supplied with a first synchronization pulse 111a of the synchronization signal 111 (Sync0), while the rest of the synchronization pulses 111b–111n are derived successively from the respective preceding memory module 105a–105n. This means that, when a specific data burst 110i has been read from the appropriate memory module 105i, a subsequent rising clock edge 102a of the clock signal 102 generates a synchronization signal 111i+1 which prompts the subsequent memory module 105i+1 to read the data burst 110i+1. In this way, the memory modules 105a–105n are linked in a chain and a data stream 112 can be read, with only one memory module 105a–105n advantageously being addressed at any one time, which means that power consumption in the overall memory module array 106 is reduced.

Another advantage is that the memory apparatus 100 illustrated in FIG. 1 drastically reduces any influence of radio-frequency and other interference, since a read operation respectively involves only one memory module 105a–105n in the memory module array 106 being simultaneously active, in which case small stray coupling effects ("noise") arise within the memory apparatus.

It can also be seen that substantially increased data rates can be achieved when using conventional or slightly modified memory modules 105a–105n, such as conventional DRAMs, SDRAMs or DDRAMs. A considerable cost advantage of the inventive method is thus that a fast memory module array 106 can be provided using conventional DRAM memory modules, which results in a cost advantage.

It will be pointed out that, as also illustrated with reference to FIG. 2, a latency (CAS latency=CL, in this case CL=2) can be provided. In the example illustrated in FIG. 2, this means that, following a first synchronization pulse 111a for reading the data bursts 110a–110n forming the data stream 112, a "latency" of, by way of example, 2 clock cycles of the clock signal 102 elapses before a first data burst 110a and hence subsequently all the other data bursts 110b–110n are read.

In one embodiment, a clock signal 102 runs at a frequency of 800 MHz, for example, and the data rate on the data bus 101 is 800 MB/s. The sequentially addressed memory modules 105a–105n or DRAMs have a reading rate of 100 MHz, however. The sequential addressing of the eight memory modules 105a–105n illustrated in FIG. 1 means that there is no need for any identification of a specific memory module 105a–105n, for example a chip ID, as is absolutely necessary with the RAMBUS design, for example.

Another advantage is that the driven data or data streams are read in sync with a rising 102a or falling 102b clock edge of the clock signal 102, the clock signal 102 and the data stream 112 running in the same direction to a memory controller 108 illustrated in FIG. 1, which means that the clock signal 102 and the data stream 112 arrive in the memory controller 108 in sync.

It can thus be seen that the synchronization pulses 111a–111n of the synchronization signal 111 need to be provided merely as one activation signal with uncritical timing for the individual memory modules 105a–105n in the memory module array 106.

Figure 3:
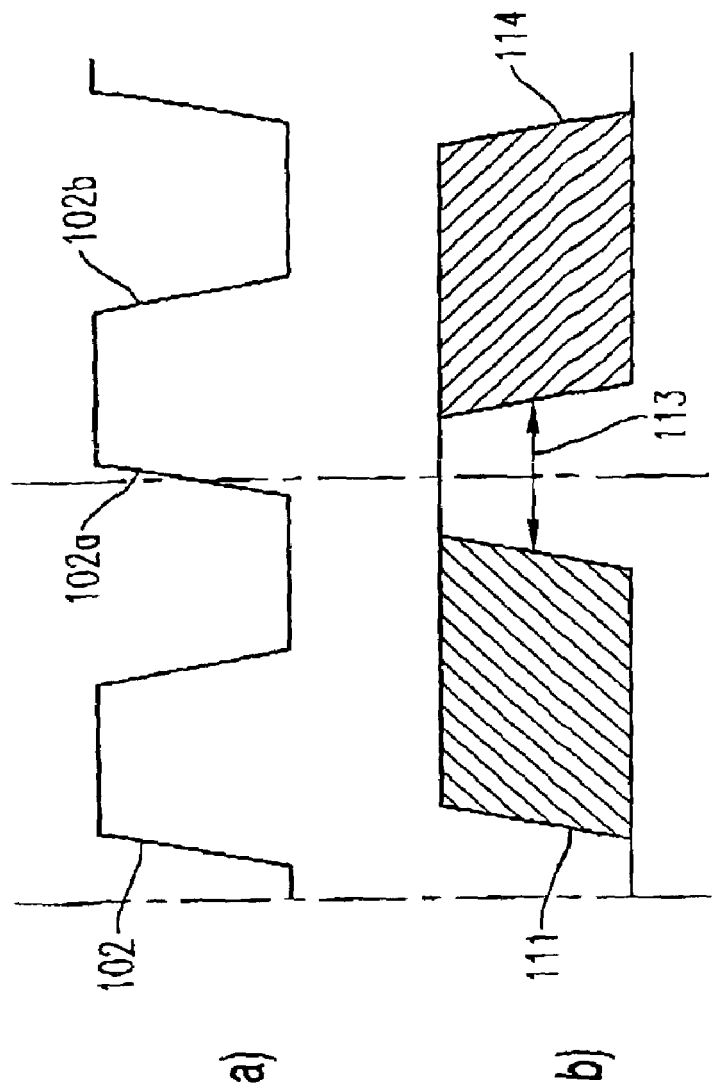
FIG. 3 shows two clock periods of the clock signal in relation to the timing of a corresponding synchronization pulse.

FIG. 3 shows the timing presets for providing the synchronization signal 111, with FIG. 3(a) showing two cycles or period durations of a clock signal 102 with rising clock edges 102a and falling clock edges 102b. Uncritical timing now refers to a synchronization time interval 113 with respect to, by way of example, a rising clock edge 102a of the clock signal 102, which interval comprises the sum of the time intervals ts and th (setup-hold). The hatched area in FIG. 3(b) corresponds to a synchronization signal variation range 114 within which a specific synchronization pulse 111a–111n can vary for the purpose of activating or addressing a specific memory module 105a–105n.

It will be pointed out that the synchronization pulse 111a–111n shown in FIG. 3(b) can also appear on a negative clock edge 102b.

Figure 4:
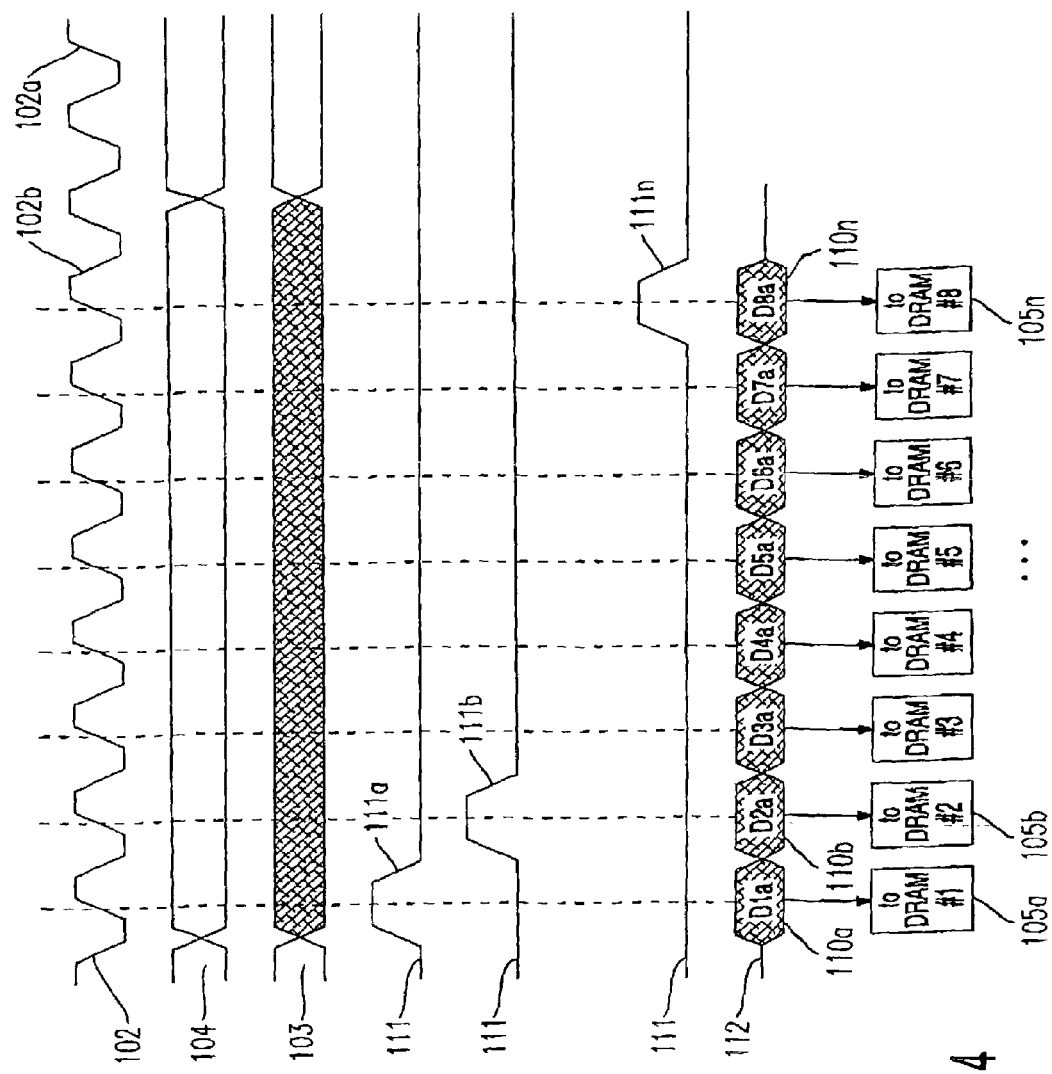
FIG. 4 shows a timing diagram for a read cycle in a memory apparatus in line with FIG. 1, with FIG. 2 showing the corresponding write cycle for this.

FIG. 4 shows a timing diagram which illustrates the operating mode for storing a data stream 112 in the memory module array 106 shown in FIG. 1. As for the read cycle described in FIG. 2, sequential reading of the data stream 112, composed of individual data bursts 110a–110n, into a memory module array 106, which in this example likewise comprises eight memory modules 105a–105n, will also be illustrated for the write cycle. While a read command was output on the command bus 103 in FIG. 2, a write command is now output on the command bus 103 in FIG. 4.

The write command and an activation synchronization pulse 111a are output by the memory controller 108 (FIG. 1). When the first data burst 110a has been stored, successive storage of the rest of the data bursts 111b–111n follows activation of the corresponding memory modules 105b–105n by the corresponding synchronization pulses 111b–111n. Chip or memory-module identification, as in the case of the RAMBUS system, for example, is again not required in this case. The write frequency of the individual memory modules 105a–105b, like the read frequency of the individual memory modules 105a–105n, is again only ⅛ of the clock frequency of the clock signal 102.

Figure 5:
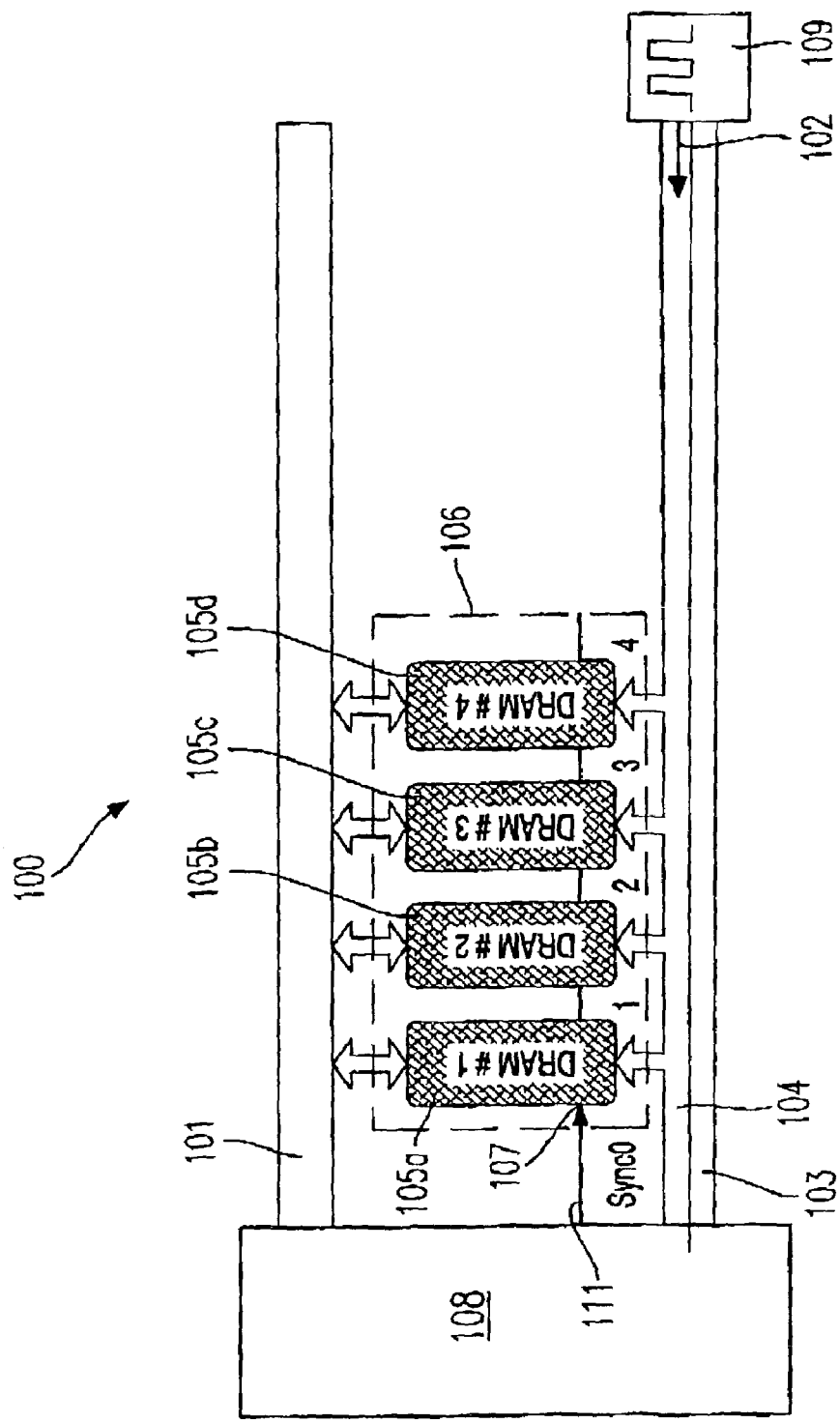
FIG. 5 shows another exemplary embodiment of the inventive memory apparatus.
Figure 6:
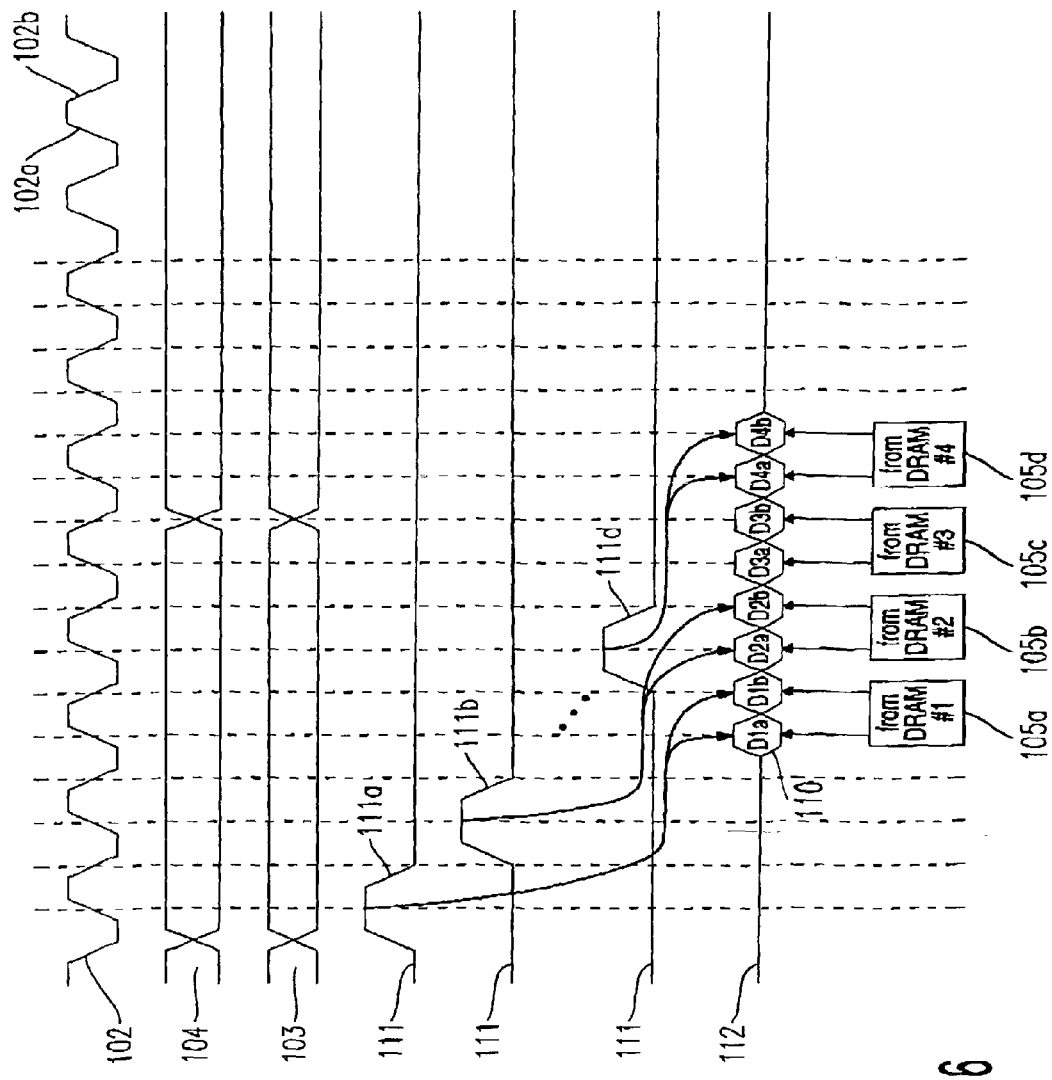
FIG. 6 shows a timing diagram for a read cycle in the memory apparatus shown in FIG. 5, using a double data rate.

FIGS. 5 and 6 show another preferred exemplary embodiment of the present invention in the form of a memory apparatus 100 (FIG. 5) and an associated timing diagram (FIG. 6). Unlike in the exemplary embodiments shown previously, the memory modules 105a–105n shown in FIG. 5 operate at twice the data rate (double data rate=DDR). The memory modules 105a–105d shown in FIG. 5 are arranged in parallel with one another and are supplied by a data bus 101, a command bus 103 and an address bus 104 and with a clock signal 102 generated by a clock signal generator 109, like the memory modules 105a–105n in FIG. 1, which means that there is no need for a detailed description at this point.

FIG. 6 shows a timing diagram for the reading of the four memory chips 105a–105d at a double data rate under the control of the synchronization signals 111a–111d. It will be pointed out that the memory module array 106 shown here, comprising four memory modules 105a–105d, is only illustrative, i.e. more or fewer than four memory modules 105a–105d with a double data rate can be provided.

The advantages of the inventive method for storing and reading data streams 112 can be provided for a memory module array 106 which has a minimum size of two memory modules 105.

As FIG. 6 shows, two data bursts D1a and D1b are read from the memory module 105a upon a first synchronization pulse 111a. The second synchronization pulse 111b, output by the first memory module 105a, in turn prompts the second memory module 105b to output the two subsequent data bursts D2a and D2b, whereupon the other two memory modules 105c and 105d are addressed in the same way, so that finally a data stream 112 has been combined. The DDR principle of reading at twice the data rate is based on the fact that data bursts 110a–110n are respectively read and written both on a rising clock edge 102a and on a falling clock edge 102b of the clock signal 102 generated by the clock signal generator 109.

It will be pointed out that the invention is not limited to the two methods, shown in FIG. 2 and FIG. 6, of a single and a double data rate, but rather that any data rate can be processed with the inventive method.

Although the present invention has been described above with reference to preferred exemplary embodiments, it is not limited thereto, but rather can be modified in a wide variety of ways.

What is claimed is:

1. A memory apparatus comprising:
a memory module array, the memory module array including
a plurality of memory modules configured to store multiple data bursts for each clock cycle of a clock signal, each memory module having
a synchronization connection for receiving a synchronization signal for synchronizing the memory module relative to other memory modules, wherein a synchronization signal is successively applied to the successive memory modules by forwarding a synchronization pulse from one memory module to a successive memory module,
whereby data bursts read from the memory modules are combined to form a data stream.

2. The memory apparatus of claim 1, wherein the memory modules are connected in parallel with each other.

3. The memory apparatus of claim 1, further comprising a data bus to which the memory modules are connected in parallel.

4. The memory apparatus of claim 1, further comprising an address bus to which the memory modules are connected in parallel.

5. The memory apparatus of claim 1, further comprising a command bus to which the memory modules are connected in parallel.

6. The memory apparatus of claim 1, further comprising a memory controller configured to generate the synchronization signal.

7. A method of forming a data stream stored as successive data bursts in successive memory modules of a memory module array, the method comprising:
successively applying a synchronization signal to the successive memory modules;
on the basis of the synchronization signal, reading the data bursts from successive memory modules;
storing multiple data bursts in a memory module for each clock cycle of a clock signal:
assembling the data bursts to form a data stream, the temporal ordering of the data bursts within the data stream being determined on the basis of the synchronization signal; and
outputting the data stream onto a data bus.

8. The method of claim 7, further comprising operating the memory module array as a synchronized array.

9. The method of claim 8, wherein operating the memory module array as a synchronized array comprises writing successive data bursts to successive memory modules at staggered times.

10. The method of claim 8, wherein operating the memory module array as a synchronized array comprises reading successive data bursts from successive memory modules at staggered times.

11. The method of claim 7, wherein applying a synchronization signal comprises applying a synchronization signal to a synchronization connection on each of the memory modules to synchronize the memory module array with a clock signal.

12. The method of claim 7, further comprising supplying a clock signal, in parallel, to each of the memory modules.

13. The method of claim 7, further comprising supplying the data stream on a data bus to which the memory modules are connected in parallel.

14. The method of claim 7, further comprising supplying a command data stream on a command bus to which the memory modules are connected in parallel.

15. The method of claim 7, further comprising supplying an address data stream on an address bus to which the memory modules are connected in parallel.

16. The method of claim 12, further comprising reading multiple data bursts from a memory module for each clock cycle of a clock signal.

17. The method of claim 7, wherein successively applying the synchronization signal comprises, in response to a clock signal, forwarding a synchronization pulse from one memory module to a successive memory module.

18. The method of claim 7, wherein successively applying the synchronization signal comprises, in response to a prescribable number of clock cycles of a clock signal, forwarding a synchronization pulse from one memory module to a successive memory module.

19. The method of claim 7, wherein successively applying a synchronization signal comprises applying the synchronization signal upon lapse of a prescribable synchronization time interval following a clock signal.

20. The method of claim 7, wherein successively applying a synchronization signal comprises applying the synchronization signal upon lapse of a prescribable synchronization time interval following a clock signal.

* * * * *